United States Patent [19]

Ban

[11] Patent Number: 5,297,084
[45] Date of Patent: Mar. 22, 1994

[54] MEMORY DEVICE WITH CURRENT MIRROR TYPE SENSE AMPLIFIERS FOR COMPARING UNITS OF REFERENCE CELLS AND INFORMATION CELLS

[75] Inventor: Akira Ban, Kanagawa, Japan

[73] Assignee: NEC Corporation, Tokyo, Japan

[21] Appl. No.: 798,646

[22] Filed: Nov. 26, 1991

[30] Foreign Application Priority Data

Nov. 27, 1990 [JP] Japan .................. 2-327737

[51] Int. Cl.[5] .................. G11C 7/00; G11C 7/02
[52] U.S. Cl. .................. 365/189.09; 365/210; 365/230.06
[58] Field of Search ............. 365/210, 189.09, 230.06

[56] References Cited

U.S. PATENT DOCUMENTS

| | | | |
|---|---|---|---|
| 4,305,139 | 12/1981 | Zbrozek | 365/203 |
| 4,648,074 | 3/1987 | Pollachek | 365/184 |
| 4,713,797 | 12/1987 | Morton et al. | 365/210 |
| 5,029,138 | 7/1991 | Iwashita | 365/210 |
| 5,132,933 | 7/1992 | Shreck et al. | 365/230.06 |

FOREIGN PATENT DOCUMENTS 54-101231 9/1979 Japan .

OTHER PUBLICATIONS

Patent Abstracts of Japan, vol. 3, No. 124 (E-144) 17 Oct. 1979.
IEEE International Solid State Circuits Conference, vol. 1989, 16 Feb. 1989, New York, US; pp. 138–139, A. Cernea et al., "Non-Volatile Memories/A 1Mb Flash EEPROM".

Primary Examiner—Eugene R. LaRoche
Assistant Examiner—Michael C. Kessell
Attorney, Agent, or Firm—Sughrue, Mion, Zinn, Macpeak & Seas

[57] ABSTRACT

A plurality of reference memory cell units are arranged to be connected to rows of matrix-patterned information memory cell units. Each of the reference memory cell units comprises a selection cell of an NMOS transistor, and three reference memory cells of depletion type NMOS transistors, and each of the information memory cell units comprises a selection cell of an NMOS transistor, and three information memory cells of NMOS transistors, one of which is of a depletion type. The selection cells are connected between the reference and information memory cells by a common selection line. The reference and information memory cells are connected by common word lines. Current mirror type sense amplifiers are connected to the columns of information memory cell units by digit lines. This arrangement avoids the occurrence of the unevenness of characteristics resulting from the fabrication process.

5 Claims, 3 Drawing Sheets

MEMORY DEVICE WITH CURRENT MIRROR TYPE SENSE AMPLIFIERS FOR COMPARING UNITS OF REFERENCE CELLS AND INFORMATION CELLS

FIELD OF THE INVENTION

This invention relates to a memory device with current mirror type sense amplifiers, and more particularly to a read only memory including a plurality of memory cell units each composed of MOS transistors.

BACKGROUND OF THE INVENTION

One type of a conventional memory device with current mirror type sense amplifiers comprises a reference memory cell unit, a plurality of information memory cell units arranged in matrix a pattern, a plurality of sense amplifiers connected to columns of the information memory cell units, and a plurality of address decoder units connected to rows of the information memory cell units. The reference memory cell unit comprises a selection NMOS transistor, and three NMOS transistors for reference memory cells, one of which is a depletion type transistor connected at a gate to ground. Each of the information memory cell units comprises a selection NMOS transistor, and three NMOS transistors for information memory cells, one of which is a depletion type, and each of the address decoder units comprises a selector connected through a selection line to the selection NMOS transistors at each row, and a three-bit address decoder connected through three word lines to the three NMOS transistors for information memory cells. Each of the sense amplifiers is connected through a common reference voltage line to the reference memory cell unit and through a digit line to the information memory cell units in each column.

In operation, a reference voltage is applied through the reference voltage line to the sense amplifiers by the reference memory cell unit. At the same time, one of the selection lines is selected by receiving a signal of "1" from a selector of an address decoder unit belonging to a selected row. In this situation, a three-bit word line signal of, for instance, "1", "0" and "1" is applied to three word lines of the selected row. In one of the information memory cell units of the selected row, if the signal of "0" is applied to an NMOS transistor of the depletion type among the three information memory cell NMOS transistors, a content of "1" is read from the memory cell through a digit line to an output signal line by one of the sense amplifier. On the other hand, if the signal of "0" is applied to one of the NMOS transistors (non-depletion type) for information memory cells, a content of "0" is read from the memory cell.

In the conventional mirror type memory device, however, there is a disadvantage in that unified characteristics are difficult to obtained between the reference memory cells and the information memory cells of a matrix pattern, because the reference memory cell unit and the information memory cell units are arranged with considerable distances in a semiconductor integrated circuit to result in the unevenness among those cells, as long as an ordinary fabrication process is adopted. In this conventional mirror type memory device, the unevenness of the characteristics becomes more remarkable due to the difference of gate signals applied through independent signal lines to those cells.

SUMMARY OF THE INVENTION

Accordingly, it is an object of the invention to provide a memory device with current mirror type sense amplifiers in which characteristics of MOS transistors can be substantially equalized between a reference memory cell unit and information memory cell units.

It is a further object of the invention to provide a memory device with current mirror type sense amplifiers in which common gate signals are applied to MOS transistors for a reference memory cell unit and information memory cell units.

According to the invention, a memory device with current mirror type sense amplifiers, comprises:

a plurality of information memory cell units arranged in a matrix pattern having a predetermined number of columns and a predetermined number of rows, each of the information memory cell units comprising a selection cell and information memory cells, information being stored into at least one of the information memory cells;

a plurality of address decoder units each comprising a selector for controlling turning-on and off of the selection cell and an address decoder for accessing the information memory cells, the selector being connected in each row to the selection cell by a selection line, and the address decoder being connected at outputs in each row to the information memory cells by word lines;

a plurality of sense amplifiers connected to columns of the information memory cell units by digit lines, respectively; and a plurality of reference memory cell units each comprising a selection sell and reference memory cells, and connected to rows of the information memory cell units, respectively, such that the selection cell is connected in the each row to the selector by the selection line, and the reference memory cells are connected in the each row to the outputs of the address decoder by the word lines, whereby one of the reference memory cell units applies a reference voltage to a reference voltage line connected to the sense amplifiers, when the selection cell is selected in one of the reference memory cell units by the selector of the address decoder unit.

BRIEF DESCRIPTION OF THE DRAWINGS

The invention will be explained in more detail in conjunction with appended drawings, wherein.

DESCRIPTION OF THE PREFERRED EMBODIMENT

Figure 1:
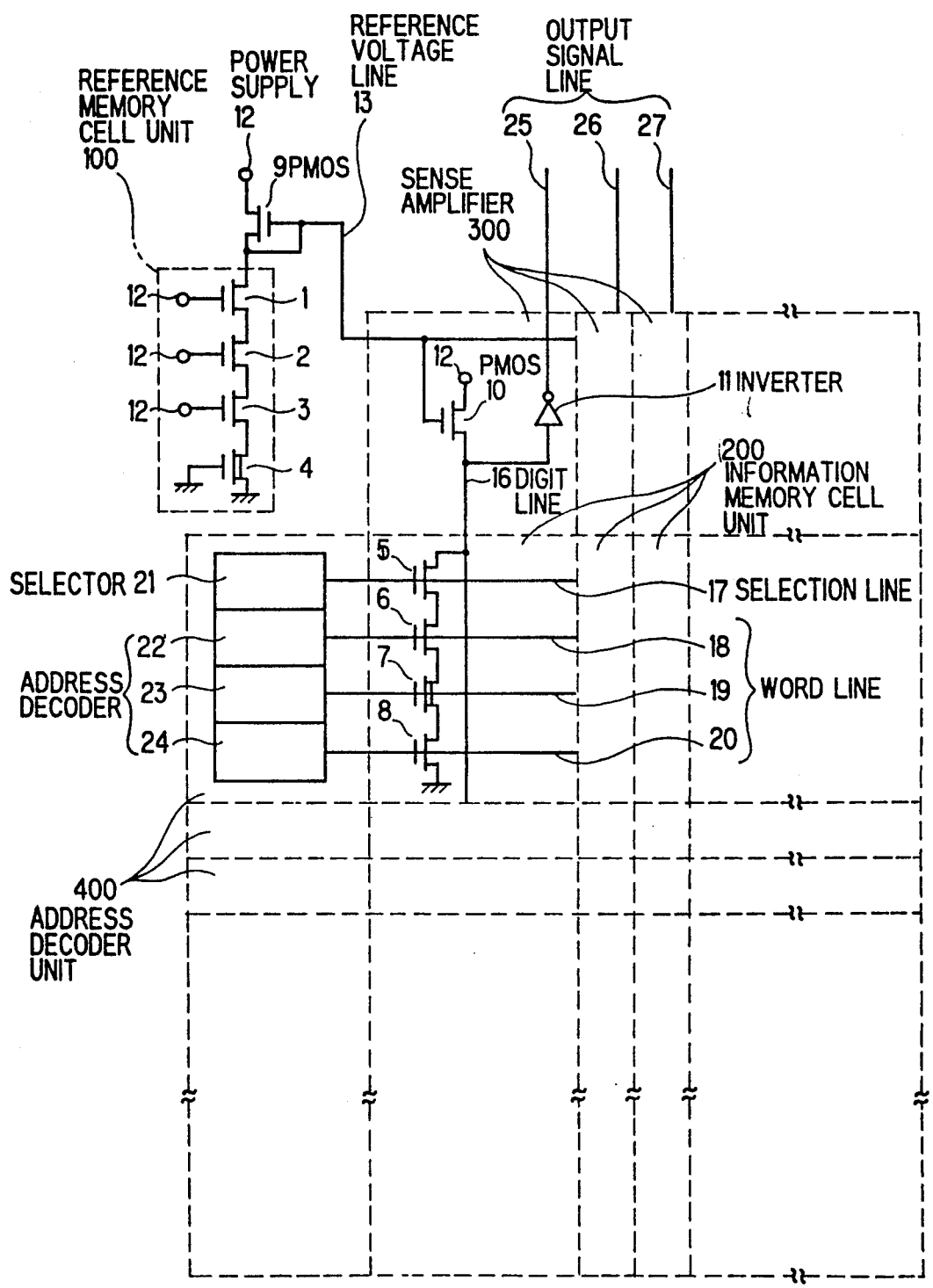
FIG. 1 is a circuit diagram showing a conventional memory device with current mirror type sense amplifiers.

Before describing a memory device with current mirror type sense amplifiers of a preferred embodiment according to the invention, the aforementioned conventional memory device with current mirror type sense amplifiers will be explained in FIG. 1.

The conventional memory device with current mirror type sense amplifiers comprises a reference memory cell unit 100, information memory cell units 200 arranged in a matrix pattern, sense amplifiers 300 connected through a reference voltage line 13 to the reference memory cell unit 100 and through digit lines 16 to columns of the information memory cell units 200, and address decoder units 400 connected through selection and word lines 17 and 18 to 20 respectively, to rows of the information memory cell units 200. The reference memory cell unit 100 comprises a selection NMOS transistor 1, reference NMOS transistors 2 and 3, and a reference NMOS transistor 4 of depletion type connected in serial by source-drain path, wherein the selection NMOS transistor 1 is connected in source-drain path to a source-drain path and a gate of a PMOS transistor 9 connected to a high voltage power supply 12, the selection and reference NMOS transistors 1, 2 and 3 are connected at gates to the high voltage power supply 12, and the gate of the depletion type NMOS transistor 4 is connected to ground. The information memory cell unit 200 comprises a selection NMOS transistor 5, information memory cell NMOS transistors 6 to 8, among which the NMOS transistor 7 is of a depletion type, connected in serial between a digit line 16 and ground by source-drain path, wherein the gate of the selection NMOS transistor 5 is connected to a selection line 17, and the gates of the information memory cell NMOS transistors 6 to 8 are connected to word lines 18 to 20. The sense amplifier 300 comprises a PMOS transistor 10 connected in source-drain path to the high voltage power supply 12 and the digit line 16. The gate of the PMOS transistor 10 is connected to the reference voltage line 13, and an inverter 11 connected at an input to a nodal point between the source-drain path of the PMOS transistor 10 and the digit line 16 and at an output to an output signal line 25 which is provided in parallel to other output signal lines 26, 27, . . . . The address decoder unit 400 comprises a selector 21 connected through the selection line 17 to a gate of the selection NMOS transistor 5, and gates of selection NMOS transistors of other memory cell units of the same row, and an address decoder having an output of three bits 22, 23 and 24 is connected through the word lines 18, 19 and 20 to gates of the memory cell NMOS transistors 18, 19 and 20, and gates of memory cell NMOS transistors of the other memory cell units of the same row.

In operation, the selection and reference memory cell NMOS transistors 1 to 4 are turned on in the reference memory cell unit 100, so that the PMOS transistor 9 is turned on, when a potential of the selection NMOS transistor 1 is lowered at a drain to be a predetermined value. As a result, the drain of the selection NMOS transistor 1 is maintained to be an intermediate potential VR between potentials of the high voltage power supply 12 and ground, so that the reference voltage line 13 is also maintained to be the potential VR.

Here, it is assumed that a signal of "1" (high voltage) is applied to the selection line 17 by the selector 21, and a signal of "1", "0" ground potential), and "1" is applied to the word lines 18 to 20, respectively, as the three bit signals 22 to 24 by the address decoder, so that the selection and information memory cell NMOS transistors 5 to 8 are turned on. On the other hand, selection NMOS transistors connected to the digit line 16 are turned off in other rows, because selectors of address decoder units of the other rows supply the ground level potential to selection lines thereof. In the sense amplifier 300, the PMOS transistor 10 is turned on based on the intermediate potential VR applied to the gate thereof. As a result, a potential of the digit line 16 is set to be a value between the high and ground potentials determined by a ratio of serial resistances of the PMOS transistor 10, the selection NMOS transistor 5, and the memory cell NMOS transistors 6 to 8, among which the NMOS transistor 7 is of the depletion type. This digit line potential is determined to be a low level by the inverter 11, so that a high level signal is obtained as a content of the memory cell unit 200 at the output signal line 25.

On the other hand, if the address decoder of the address decoder unit 400 supplies the three bit signals 22 to 24 of "1", "1" and "0" to the word lines 18 to 20, the memory cell NMOS transistor 8 is not turned on, although the remaining NMOS transistors are turned on, so that the digit line 16 is set to be at a high potential. Consequently, a low level signal is read from the memory cell unit 200 to be obtained at the output signal line 25.

Figure 2A:
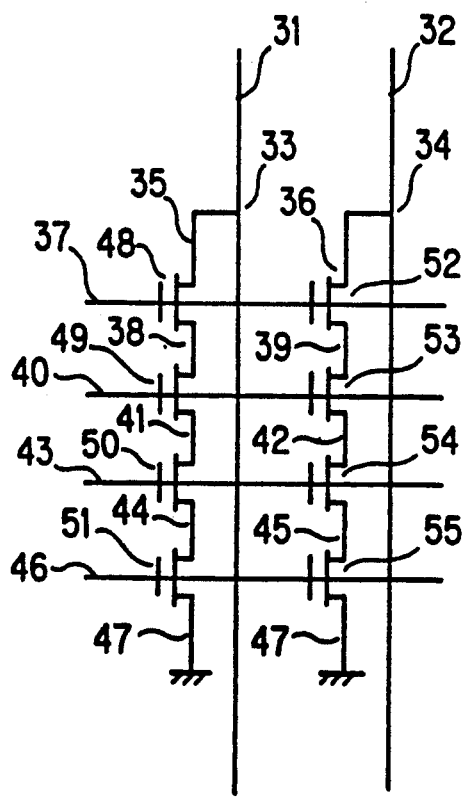
FIGS. 2A and 2B are circuit and schematic diagrams showing information memory cell units arranged on a semiconductor integrated circuit chip.
Figure 2B:
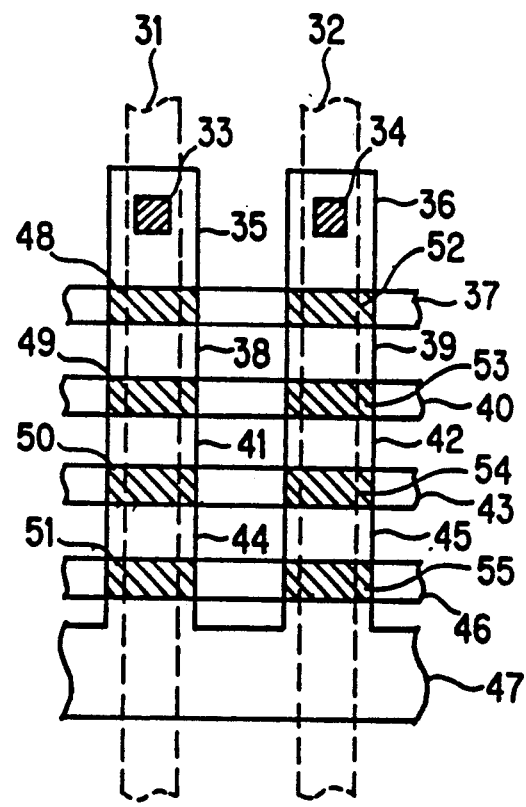

FIGS. 2A and 2B show the arrangement of information memory cell units provided on a chip of a semiconductor integrated circuit. The information memory cell units comprise selection NMOS transistors 48 and 52 having gates realized by an interconnection functioning as a selection line 37, information memory cell NMOS transistors 49 and 53 having gates realized by an interconnection functioning as a word line 40, information memory cell NMOS transistors 50 and 54 having gates realized by an interconnection functioning as a word line 43, and information memory cell NMOs transistors 51 and 55 having gates realized by an interconnection functioning as a word line 46. In the information memory cell units, reference numerals 31 and 32 denote digit lines, 33 a connection point (through hole) between the drain diffusion layer 35 and the digit line 31, 34 a connection point (through hole) between the drain diffusion layer and the digit line 32, 35 and 36 drain diffusion layers of the NMOS transistors 48 and 52, 38 a source diffusion layer of the NMOS transistor 48 and a drain diffusion layer of the NMOS transistor 49, 39 a source diffusion layer of the NMOS transistor 52 and a drain diffusion layer of the NMOS transistor 53, 41 a source diffusion layer of the NMOS transistor 49 and a drain diffusion layer of the NMOS transistor 50, 42 a source diffusion layer of the NMOS transistor 53 and a drain diffusion layer of the NMOS transistor 54, 44 a source diffusion layer of the NMOS transistor 50 and a drain diffusion layer of the NMOS transistor 51, 45 a source diffusion layer of the NMOS transistor 54 and a drain diffusion layer of the NMOS transistor 56, and 47 source diffusion layers (ground potential) of the NMOS transistors 51 and 55.

In the information memory cell NMOS arrangement as described above, the unevenness of characteristics of the NMOS transistors resulting from the fabrication process can be small, because the NMOS transistors are addressed by the common word lines, and are fabricated with short distances on the chip.

However, the unevenness of characteristics are not negligible between a reference cell unit and information memory cell units for the reasons set out before.

Next, a memory device with current mirror type sense amplifiers of the preferred embodiment according to the invention will be explained in FIG. 3.

The current mirror type memory device comprises reference memory cell units 100, information memory cell units 200 arranged in matrix pattern, sense amplifiers 300 connected to columns of the information memory cell units 200, and address decoder units 400 connected to rows of the information memory cell units 200. The reference memory cell units 100 are arranged to correspond to the rows of the information memory cell units 200. Each of the reference memory cell units 100 comprises a selection NMOS transistor 1 and reference memory cell NMOS transistors 2 to 4 of a depletion type. The NMOS transistors 1 to 4 are connected in serial by source-drain path, wherein the selection NMOS transistor is connected at a drain to a reference voltage line 13 and at a gate to a selection line 17, the depletion type NMOS transistors 2 to 4 are connected at gates to word lines 18 to 20, respectively, and the depletion type NMOS transistor 4 is connected at a source to ground. A PMOS transistor 9 is connected at a source to a high voltage power supply 12, and at gate and drain to the reference voltage line 13. In one of the information memory cell units 200, a selection NMOS transistor 5, and information memory cell NMOS transistors 6 to 8, among which the NMOS transistor 7 is of a depletion type, are connected in serial by source-drain path, wherein a drain of the selection NMOS transistor 5 is connected to a digit line 16 and a source of the information memory cell NMOS transistor 8 is connected to ground. Each of the sense amplifiers 300 comprises a PMOS transistor 10 connected at a source to the high voltage power supply 12, at a gate to the reference voltage line 13, and at a drain to the digit line 16, and an inverter 11 connected an input to the digit line 16 and at an output to an output signal line 25 provided in parallel to other output signal lines 26, 27, . . . . Each of the address decoder units 400 comprises a selector 21 having a selection line 17 connected to gates of the selection NMOS transistors 1 and 5, and other selection NMOS transistors of the same row, and an address decoder of three bit outputs 22 to 24 connected to word lines 18 to 20, to which gates of the reference memory cell and information memory cell NMOS transistors 2 to 4 and 6 to 8 are connected, respectively.

Figure 3:
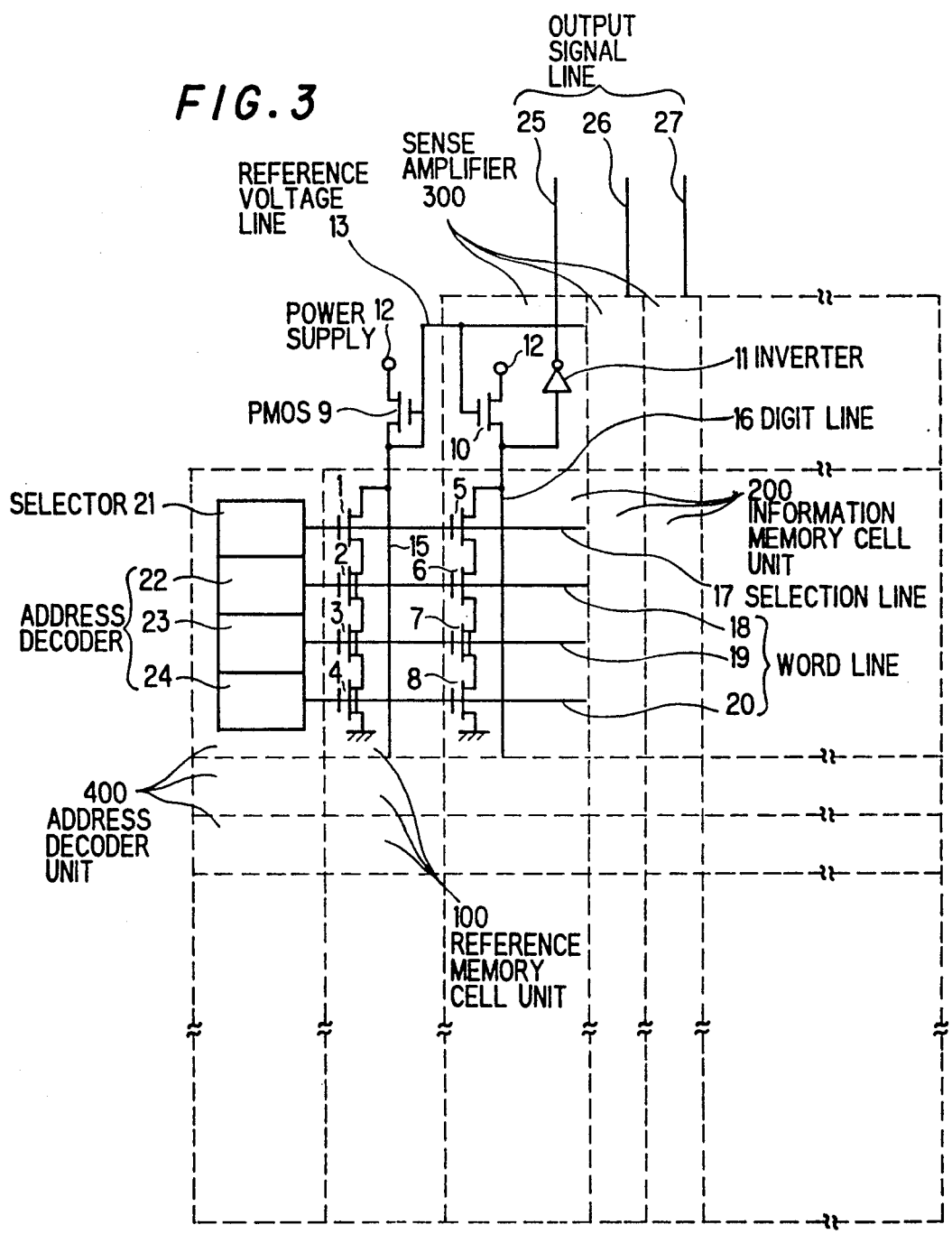
FIG. 3 is a circuit diagram showing a memory device with current mirror type sense amplifiers of a preferred embodiment according to the invention.

As understood from illustration of FIG. 3, one column of the reference memory cell units 100 of the number equal to that of rows of the information memory cell units 200 are provided in the similar pattern that one column of the address decoder units 400 are provided to address one of the rows of the information memory cell units 200. On the other hand, one row of the sense amplifiers 300 of the number equal to that of columns of the information memory cell units 200 are provided to read information therefrom in parallel to the output signal lines 25, 26, 27, . . . .

In operation, a potential of the selection line 17 is set to be a high potential by the selector 21 of the address decoder unit 400, so that the selection NMOS transistor 1 of the reference memory cell unit 100 is turned on. As a result, the reference voltage line 13 is connected through the selection NMOS transistor 1 and the depletion type NMOS transistors 2 to 4 to ground, so that a potential of the reference voltage line 13 is set to be the intermediate potential VR, as described before. Simultaneously, the information memory cell units 200 of the same row are connected to the digit line 16 and other digit lines in accordance with the turning-on of the selection NMOS transistor 5 and other selection NMOS transistors of the same row. Thus, information is read from the information memory cell units 200 of the same row, as described before.

This invention may be applied to an ultraviolet ray erasing type programmable read only memory in which a potential of word lines is set to be higher than a high voltage of a power supply.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A memory device with current mirror type sense amplifiers, comprising:
   a plurality of information memory cell units arranged in a matrix pattern having a predetermined number of columns and a predetermined number of rows, each of said information memory cell units comprising a first selection cell and information memory cells, information being stored in said information memory cells;
   a plurality of address decoder units each comprising a selector for controlling turning-on and off of said first selection cell and an address decoder for accessing said information memory cells, said selector being connected in each row to said selection cell by a selection line, and said address decoder being connected at outputs in said each row to said information memory cells by word lines;
   a plurality of sense amplifiers connected to columns of said information memory cell units by digit lines, respectively; and
   a plurality of reference memory cell units each comprising a second selection cell and reference memory cells including depletion-type NMOS transistors, and connected to rows of said information memory cell units, respectively, such that said second selection cell is connected in said each row to said selector by said selection line, and said reference memory cells are connected in said each row to said outputs of said address decoder by said word lines, whereby one of said reference memory cell units applies a reference voltage to a reference voltage line connected to said sense amplifiers, when said second selection cell is selected in said one of said reference memory cell units by said selector of said address decoder unit.

2. A memory device with current mirror type sense amplifiers, according to claim 1, wherein:
   said first selection cell and said information memory cells are NMOS transistors in said each of said information memory cell units; and
   said second selection cell and said reference memory cells are NMOS transistors in said each of said reference memory cell units, such that said NMOS transistors are of a depletion type for said reference memory cells.

3. A memory device with current mirror type sense amplifiers, according to claim 1, wherein:
   each of said information memory cell units comprises a selection NMOS transistor connected at its gate to said selection line, and three information memory cell NMOS transistors connected at their gates to said word lines, all connected in serial between said digit line and ground by source-drain path; and
   each of said reference memory cell units comprises a selection NMOS transistor connected at its gate to said selection line, and three reference memory cell NMOS transistors of a depletion type connected at their gates to said word lines, all connected in serial between said reference voltage line and ground by source-drain path.

4. A memory device with current mirror type sense amplifier, according to claim 1, wherein:
   said reference memory cell units are connected to said sense amplifiers by said reference voltage line;
   said reference voltage line is connected to a drain and a gate of a first PMOS transistor connected at a source to a high voltage power supply; and
   each of said sense amplifiers comprises a second PMOS transistor connected at a gate to said reference voltage line, at a drain to said digit line, and at a source to said high voltage power supply, and an inverter connected at an input to said digit line connected to said drain of said second PMOS transistor, and at an output to an output signal line.

5. A memory device with current mirror type sense amplifiers, according to claim 1, wherein:
   said information is stored in said information memory cells in accordance with on and off states of said information memory cells.

* * * * *